US008722544B2

(12) United States Patent
Barr et al.

(10) Patent No.: US 8,722,544 B2
(45) Date of Patent: May 13, 2014

(54) METHOD OF CLEANING AND MICRO-ETCHING SEMICONDUCTOR WAFERS

(75) Inventors: Robert K. Barr, Shrewsbury, MA (US); Raymond Chan, Westborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 6 days.

(21) Appl. No.: 12/904,609

(22) Filed: Oct. 14, 2010

(65) Prior Publication Data

US 2011/0250762 A1 Oct. 13, 2011

Related U.S. Application Data

(60) Provisional application No. 61/278,942, filed on Oct. 14, 2009.

(51) Int. Cl.
*H01L 21/302* (2006.01)
*H01L 21/461* (2006.01)
*C11D 7/32* (2006.01)
*C25F 3/00* (2006.01)

(52) U.S. Cl.
USPC .............................. 438/745; 510/175; 216/96

(58) Field of Classification Search
USPC ......................................................... 438/745
See application file for complete search history.

(56) References Cited

U.S. PATENT DOCUMENTS

| 5,259,888 | A | 11/1993 | McCoy |
| 5,466,389 | A * | 11/1995 | Ilardi et al. .................... 510/175 |
| 5,945,393 | A | 8/1999 | Tracy et al. |
| 5,958,863 | A | 9/1999 | Keys |
| 5,989,353 | A | 11/1999 | Skee et al. |
| 6,568,384 | B1 | 5/2003 | Onizaki |
| 6,599,370 | B2 | 7/2003 | Skee |
| 7,235,516 | B2 | 6/2007 | Morinaga et al. |
| 7,312,186 | B2 | 12/2007 | Takashima et al. |
| 7,955,989 | B2 | 6/2011 | Barr et al. |
| 2001/0039251 | A1 | 11/2001 | Sachdev et al. |
| 2002/0000239 | A1 | 1/2002 | Sachdev et al. |
| 2004/0259761 | A1 | 12/2004 | Yokoi et al. |
| 2005/0020463 | A1 * | 1/2005 | Ikemoto et al. ............... 510/175 |
| 2006/0135045 | A1 | 6/2006 | Bian et al. |
| 2007/0135322 | A1 * | 6/2007 | Morinaga et al. ............. 510/175 |
| 2008/0221004 | A1 | 9/2008 | Farkas |
| 2009/0007940 | A1 | 1/2009 | Zapilko et al. |
| 2009/0118153 | A1 | 5/2009 | Rath et al. |
| 2009/0133716 | A1 | 5/2009 | Lee |
| 2009/0218542 | A1 | 9/2009 | Isami et al. |
| 2009/0280597 | A1 * | 11/2009 | Wijekoon et al. ............... 438/71 |
| 2010/0248494 | A1 | 9/2010 | Barr et al. |

FOREIGN PATENT DOCUMENTS

| EP | 2302701 A2 | 3/2011 |
| EP | 2337089 A2 | 6/2011 |
| KR | 10-2008-0106638 | 12/2008 |

OTHER PUBLICATIONS

"Sodium Hydroxide Density" (Web Page).*
Polyethylene_glycol_MW1450_MSDS (Web page, Issue Date: Mar. 28, 2007).*
Polyethylene_glycol_MW1450 (Web page).*
Tripropylene_glycol_MSDS.*
Polyethylene_glycol_MW 1450 (Webpage, issued date : Jan. 9, 2013).*
Sodium Hydroxide Density (Webpage, issued date: Apr. 4, 2012).*
Tripropylene_Glycol_MSDS (Webpage, issued date : Nov. 2003.*
European Search Report of corresponding European Application No. 10 18 7469; communication mailed Feb. 11, 2014.

* cited by examiner

*Primary Examiner* — Binh X Tran
*Assistant Examiner* — Thomas Pham
(74) *Attorney, Agent, or Firm* — John J. Piskorski

(57) ABSTRACT

A method of simultaneously cleaning inorganic and organic contaminants from semiconductor wafers and micro-etching the semiconductor wafers. After the semiconductor wafers are cut or sliced from ingots, they are contaminated with cutting fluid as well as metal and metal oxides from the saws used in the cutting process. Aqueous alkaline cleaning and micro-etching solutions containing alkaline compounds and mid-range alkoxylates are used to simultaneously clean and micro-etch the semiconductor wafers.

7 Claims, No Drawings

METHOD OF CLEANING AND MICRO-ETCHING SEMICONDUCTOR WAFERS

This application claims the benefit of priority under 35 U.S.C. §119(e) to U.S. Provisional Application No. 61/278,942, filed Oct. 14, 2009, the entire contents of which application are incorporated herein by reference.

The present invention is directed to a method of simultaneously cleaning semiconductor wafers of inorganic and organic contaminants and micro-etching the semiconductor wafers. More specifically, the present invention is directed to a method of simultaneously cleaning semiconductor wafers of inorganic and organic contaminants and micro-etching the semiconductor wafers with an aqueous alkaline solution containing alkaline compounds and mid-range alkoxylates.

Conventionally, semiconductor wafers may be fabricated by the following steps:

(1) a semiconductor ingot is sliced by an inner diameter saw to obtain a wafer;

(2) the wafer is washed with water to remove contaminants; and (3) the wafer is then cleaned to remove contaminants including heavy metals and particles and then dried.

Such wafers are typically used in the manufacture of photovoltaic devices, such as solar cells. A solar cell is a device that converts light energy incident on its surface such as sunlight into electric energy. Various approaches have been attempted to increase the absorbance of energy. One of such approaches is to reduce reflectance of light incident on the surface of the solar cell. Reducing of the reflectance of light allows the efficiency of converting light into electric energy to be improved. Typically texturing is done to a surface of the semiconductor wafer in a predetermined condition with an alkaline aqueous solution such as sodium hydroxide. Such texturing may form pyramid structures of greater than 1 μm in height to improve light absorbance of the wafer.

Prior to texturing, the semiconductor ingot is sliced to a desired size and shape using an inner diameter saw. During the cutting process metal from the saw such as iron, iron oxide, copper, copper oxide and zinc contaminate the surface of the sliced semiconductor. In addition, slurries applied to the saw during cutting also contaminate the semiconductor. Cutting semiconductor ingots using a slurry that is either a mixture of free abrasive particles, such as silicon carbide, and an organic material or oil base such as a mineral oil, or a mixture of free abrasive particles and an aqueous solution base such as polyethylene glycol, improve the cutting process by reducing residual processing distortion, suppress process stress and suppress cutting heat. Further, by the addition of alkaline hydroxides to such slurries process stress (residual distortion) produced by cutting is eliminated providing low-distortion wafers. Such a method is disclosed in U.S. Pat. No. 6,568,384. Such abrasive particles and organic materials contaminant the semiconductor wafer. If they are not removed, they may compromise the texturing process and undesirably increase reflectance of the final solar cell article. Accordingly, removal of such surface contaminants is important for achieving desired solar cell performance.

Conventional methods of cleaning the semiconductor wafers, such as with water and alkaline cleaners, have not been found to be satisfactory to many workers in the semiconductor industry. Metals such as iron and copper are difficult to remove, in particular iron. If iron is not removed from the wafer, iron oxide, as indicated by black spots, forms on the wafer compromising incident light absorbance of the wafer. Some alkaline cleaners have been found to remove organic materials well but not metals. Accordingly, there is a need in the semiconductor industry for an improved method of removing contaminants from a semiconductor wafer to improve the overall performance and appearance of the semiconductor wafer; and minimize contamination of the wafer with conducting metals which may reduce the efficiency of the solar cells.

In one aspect a method includes providing a semiconductor ingot; cutting the semiconductor ingot to form one or more semiconductor wafers comprising inorganic contaminants and organic contaminants; and applying an aqueous alkaline solution comprising one or more quaternary ammonium hydroxides, one or more alkali hydroxides and one or more mid-range alkoxylates in sufficient amounts to remove the contaminants and micro-etch the semiconductor wafers.

In another aspect a composition includes one or more quaternary ammonium hydroxides, one or more alkali metal hydroxides and one or more mid-range alkoxylates in sufficient amounts to remove inorganic and organic contaminants from a semiconductor wafer and micro-etch the semiconductor wafer.

The method is used to remove contaminants on a semiconductor wafer after it has been cut from an ingot and prior to any further processing steps. The saws used in the cutting process contaminate the surface of the semiconductor with metals such as iron, iron oxide, copper, copper oxide and zinc. The slurries used during the cutting process also contaminate the surface with organics and abrasive particles. Such contaminants are undesirable since they may compromise appearance and performance efficiency of the device in which the semiconductor is used. Metal contaminants incorporated into the silicon matrix can result in poor conductivity and an over all drop in efficiency of the device which includes the semiconductor. In addition to cleaning metals, organics and abrasive particles from semiconductor wafers, the method is compatible with ultrasonic cleaning processes, is low foaming, environmentally friendly, and flexible to customize to customer processes. The method also micro-etches the semiconductor wafer. The micro-etching helps remove encrusted residues, such as iron, copper, silicon carbide and silica and metals in general which may be trapped in the silicon matrix of the wafer within the first 10 nm of the wafer surface.

As used throughout this specification, the term "composition" and "bath" are used interchangeably. The term "selectively depositing" means that deposition occurs at specific desired areas on a substrate. The term "flash point" means the lowest temperature at which the vapor of a combustible liquid can be ignited in air. As used throughout this specification, the following abbreviations have the following meaning, unless the context indicates otherwise: ° C.=degrees Centigrade; gm=gram; L=liter; mL=milliliter; cm=centimeters; ppm=parts per million; ppb=parts per billion; wt %=weight percent; A=amperes; m=meters; dm=decimeter; cm=centimeter; μm=microns; nm=nanometers; min.=minutes; psig=pound-force per square inch gauge=0.06805 atmospheres; 1 atmosphere=$1.01325 \times 10^6$ dynes/cm$^2$; UV=ultraviolet; and IR=infrared. The term "lux=lx" is a unit of illumination equal to one lumen/m$^2$; and one lux=1.46 milliwatts of radiant electromagnetic (EM) power at a frequency of 540 tetrahertz. All percentages and ratios are by weight unless otherwise indicated. All numerical ranges are inclusive and combinable in any order, except where it is logical that such numerical ranges are construed to add up to 100%.

Semiconductor wafers may be cut from ingots using any conventional method known in the art. In general, ingots are cut using conventional wire saw apparatus. An example of such a wire saw apparatus is disclosed and illustrated in U.S. Pat. No. 6,568,384. The wire used in the saw is such that abrasive particles such as carborundum, diamond, silicon carbide or other abrasive particles having a size of #100 to #6000 adhere to it. A bonding agent may be applied to the wire to cause the abrasives to adhere to it.

Slurries used in the cutting process are a mixture of free abrasive particles and an oil base or aqueous solution base. The oil base used is a mineral oil in which a dispersant and thickener have been mixed. The aqueous solution base used includes various additives added to 30% to 80% water or polyethylene glycol. Silicon carbide, green silicon carbide or various metal and oxide grits may be used as the free abrasive particles. Typically silicon carbide having particles sizes of #600 to #1000 is used.

The specific formulations and amounts of components in slurries may vary as determined by preferences of workers. Typically, the slurry is a mixture of a solution of mineral oil as the base to which silicon carbide is added. The mixture ratio may range from base:silicon carbide=1:1 to 1:1.3. An aqueous base slurry may include silicon carbide added to 30% to 80% water or polyethylene glycol in a mixture of base:silicon carbide of 0.8 to 0.9:1.

The process of cutting the ingot to form a semiconductor wafer results in many contaminants on the surface of the wafer. Metals from the wire saw such as iron, iron oxide, copper, copper oxide and zinc as well as the organic materials, such as mineral oil and polyethylene glycol and abrasive particles as well as other additives which are conventionally included in slurries coat the surfaces of the wafer. Prior to any further processing steps the semiconductor wafer is cleaned and micro-etched using an aqueous alkaline composition including one or more quaternary ammonium hydroxides; one or more alkaline hydroxides and one or more mid-range alkoxylates. "Micro-etching" means that silicon is removed from the wafer and an irregular surface roughness of 0.025 µm to 2 µm (peak-to-valley height), or such as from 0.1 µm to 0.4 µm is formed on the wafer surfaces. Native oxide ($SiO_2$) is also removed in micro-etching as well as encrusted residues.

The aqueous alkaline cleaning and micro-etching compositions may be applied to the semiconductor wafer by any suitable method known in the art. The semiconductor wafer may be immersed in the aqueous alkaline cleaning and micro-etching compositions, the compositions may be sprayed on the semiconductor wafer or the compositions may be used in conventional ultrasonic cleaning processes. The aqueous alkaline cleaning and micro-etching compositions may be applied at temperature ranges from 30° C. to 90° C., typically from 45° C. to 60° C. The aqueous micro-etching solution is applied to a surface of the semiconductor substrate for dwell times of 5 min. to 40 min., typically from 10 min. to 30 min. The semiconductor substrate is then optionally rinsed with water. After the semiconductor wafer is cleaned of contaminants and micro-etched, it is processed using conventional methods in the manufacture of photovoltaic devices, such as solar cells.

The aqueous alkaline cleaning and micro-etching method is suitable to clean and micro-etch semiconductor wafers in general. The pH of the aqueous alkaline cleaning and micro-etching composition ranges from 11 and higher, typically from 12 to 13, more typically from 12 to 12.5. Semiconductor wafers may be crystalline or amorphous. The crystalline type may be monocrystalline or polycrystalline. A clean surface is important in achieving optimum appearance and efficiency of photovoltaic devices. Any contaminants on the surface of the wafer may ultimately compromise the performance of the photovoltaic devices. The method removes substantially all of the metals, metal oxides and organic compounds from the wafer surface. Iron and copper are especially difficult to remove using water. Iron in particular is problematic because it forms iron oxide on the wafer surface. Once iron oxide forms on the wafer surface it is very difficult to remove and compromises the overall incident light absorbance of the wafer. Further, if substantial amounts of iron remain on the wafer surface, the black spots characteristic of iron oxide formation become worse over time. The method reduces contaminants to levels in the ppb range and lower. Typically, after the aqueous alkaline cleaning and micro-etching composition is applied to the semiconductor wafer the contaminants range from 0 ppb to 10 ppb. By providing a clean wafer surface the method prepares the wafer surface for texturing (pyramid formation). The texturing or pyramid formation reduces incident light reflectance and improves the conversion of light energy into electrical energy in the completed photovoltaic device. In general, texturing is directed to providing a uniform surface roughness of 1 µm and greater, typically from 1 µm to 10 µm.

The weight ratio of quaternary ammonium hydroxide to alkali metal hydroxide ranges from 2:1 to 1:2, typically 1.5:1 to 1:1.5, more typically 1.25:1 to 1:1.25, most typically 1:1. Quaternary ammonium hydroxides include, but are not limited to, tetramethyl ammonium hydroxide (TMAH), tetraethyl ammonium hydroxide, tetrapropyl ammonium hydroxide, tetrabutyl ammonium hydroxide, tetramethyl-2-hydroxylethyl ammonium hydroxide (choline), trimethyl-3-hydroxypropyl ammonium hydroxide, trimethyl-3-hydroxybutyl ammonium hydroxide, trimethyl-4-hydroxybutyl ammonium hydroxide, tritriethyl-2-hydroxylethyl ammonium hydroxide, tripropyl-2-hydroxyethyl ammonium hydroxide, tributyl-2-hydroxylethyl ammonium hydroxide, dimethylethyl-2-hydroxyethyl ammonium hydroxide, dimethyldi(2-hydroxyethyl ammonium hydroxide, monomethyltri(2-hydroxyethyl) ammonium hydroxide, monomethyltriethyl ammonium hydroxide, monomethyltripropyl ammonium hydroxide, monomethyltributyl ammonium hydroxide, monoethyltrimethyl ammonium hydroxide, monoethyltributyl ammonium hydroxide, dimethyldiethyl ammonium hydroxide and dimethyldibutyl ammonium hydroxide. Quaternary ammonium hydroxides are included in amounts of 0.01 wt % to 15 wt % of the aqueous cleaning and micro-etching composition. Typically, the quaternary ammonium hydroxides are included in amounts of 1 wt % to 10 wt %.

Alkali metal hydroxides include potassium, sodium hydroxide and lithium hydroxide. Typically sodium hydroxide and potassium hydroxide are used. More typically, potassium hydroxide is used. Such alkali metal hydroxides are included in amounts of 0.01 wt % to 10 wt % of the aqueous cleaning and micro-etching composition. Typically, the alkali metal hydroxides are included in amounts of 0.5 wt % to 8 wt %.

Nonionic mid-range alkoxylate surfactants provide dynamic wetting of the semiconductor surface and are also low foaming. Dynamic wetting means that the surfactants displace another liquid or air from the surface of the semiconductor wafer. This enables rapid and efficient removal of many contaminants adhering to the wafer surface. In addition the nonionic mid-range alkoxylate surfactants are bio-degradable thus they are environmentally friendly. In one embodiment mid-range alkoxylate non-ionic surfactants include compounds having a general formula:

$$R^1—O—[(CH_2CH(R^2)—O)_x(CH_2CH_2O)_y]_z—H \qquad (I)$$

wherein x is independently at each occurrence, 0 or a real number from 1 to 11, provided that, in at least one occurrence, x is greater than 0; y is, independently at each occurrence, 0, or a real number from 1 to 20, provided that, in at least one occurrence, y is greater than 0; z is a whole number from 1 to 50; $R^1$ is a $C_{6-10}$ branched or linear alcohol; and $R^2$ is, independently at each occurrence, —$CH_3$ or —$CH_2CH_3$.

It is understood that "x" and "y" represent average degrees of, respectively, propoxylation or butoxylation, depending on the identity of $R^2$, and ethoxylation. Thus, x and y need not be whole numbers. Taken together, x and y establish a degree of alkoxylation in an oligomer distribution. It is apparent that the order of x and y is block or random with x being the first or last block.

Likewise, "z" is a whole number, as it represents the number of iterations of the formula. For example, for a $PO_x$-$EO_y$-$BO_x$ oligomer, z is 2 and the second y is zero. For $EO_y$-$BO_x$-$PO_x$-oligomer, z is 3, with the first x and the second and third y's zero.

In another embodiment mid-range alkoxylate nonionic surfactants include compounds having a general formula:

$$R^1—O—(CH_2CH(R^2)—O)_x(CH_2CH_2O)_y—H \quad (II)$$

wherein x is a real number from 1 to 11; y is a real number from 1 to 20; $R^1$ is $C_{6-10}$ branched or linear alcohol; and $R^2$ is —$CH_3$ or —$CH_2CH_3$.

In one embodiment x is typically 4, 5 or 6, more typically 5. In one embodiment y is typically 3, 6, 9 or 11, more typically 6.

$R^1$ may be $C_{6-10}$ branched or linear alcohol. Typically $R^1$ is a $C_{8-9}$ branched alcohol. In one embodiment $R^1$ is 2-ethyl hexanol or 2-propyl hexanol, more typically 2-ethyl hexanol.

In one embodiment $R^1$ is an alcohol produced from internal octenes. Internal octenes refers to the unreacted residual or by product left behind when reacting ethylene with 1-octene to produce ethylene/1-octene copolymers. These internal octenes may be obtained as a purge stream from the process and then may be converted to alcohols by a process which is described hereinafter. Alcohols produced from internal octenes include ate least one of 1-nonanol, 2-mewthyl-1-octanol, 2-ethyl-1-septanol, 2-propyl-1-hexanol, 3-methyl-4-hydroxymethyl septane, 3-methyl-3-hydroxymethyl-septane or 2-hydroxymethyl-3-methyl septane. Typically the alcohols are a blend depending on the source of 1-octene.

In one embodiment $R^2$ is —$CH_3$ representing a propylene oxide. In other embodiments $R^2$ is —$CH_2CH_3$ representing a butylene oxide.

Typical surfactants of formula II are those where x is 4, 5 or 6; y is 3, 6, 9 or 11; $R^1$ is a $C_{8-9}$ branched alcohol and $R^2$ is —$CH_3$. Most typical surfactants of formula II are those where x is 5; y is 6; $R^1$ is 2-ethyl hexanol and $R^2$ is —$CH_3$. Typically the PO or BO portion and EO portion are the result of a block feed.

Alcohols may be converted to alcohol alkoxylates by methods such as those discussed in U.S. 2005/0170991A1. Fatty acid alcohols may also be alkoxylated using metal cyanide catalysts including, but not limited to, those described in U.S. Pat. No. 6,429,342.

Alkoxylation processes may be carried out in the presence of acidic or alkaline catalysts. Typically alkaline catalysts, such as hydroxides or alcoholates of sodium or potassium, including sodium hydroxide, potassium hydroxide, sodium methoxide, potassium methoxide, sodium ethoxide and potassium ethoxide are used. Base catalysts are typically used in amounts of 0.05 wt % to 5 wt %, more typically 0.1 wt % to 1 wt % based on the starting material. In one non-limiting embodiment a C8 olefin mixture is first converted to an alcohol and subsequently converted to form a nonionic surfactant via alkoxylation with from 2 to 5 moles of propylene oxide and from 1 to 10 moles of ethylene oxide.

The addition of alkylene oxides may, in one non-limiting embodiment, be carried out in an autoclave under pressure from 10 psig to 200 psig, typically from 60 psig to 100 psig. The temperature of alkoxylation may range from 30° C. to 200° C., typically 100° C. to 160° C. After completion of oxide feeds the product is allowed to react until the residual oxide is less than 10 ppm. After cooling the reactor to an appropriate temperature ranging from 20° C. to 130° C. the residual catalyst may be left unneutralized or neutralized with organic acids, such as acetic, propionic or citric acid. Alternatively the product may be neutralized with inorganic acids, such as phosphoric acid or carbon dioxide. Residual catalyst may also be removed using ion exchange or an adsorption media, such as diatamacious earth. The final mid-range alkoxylates are readily biodegradable and may be used in the cleaning and micro-etching compositions in amounts of 0.001 wt % to 10 wt %, or such as from 0.05 wt % to 5 wt %.

Optionally, the aqueous alkaline cleaning and micro-etching compositions include one or more alkoxylated glycols, their mono-methyl ether or mono-methyl ether acetate derivatives having a weight average molecular weight of 170 g/mole or greater and a flash point of 75° C. or greater. Typically, the weight average molecular weight of the alkoxylated glycols, their mono-methyl ether or mono-methyl ether acetate derivatives range from 170 g/mole to 4000 g/mole, more typically from 190 g/mole to 500 g/mole. Flash points typically range from 75° C. to 300° C. or such as 100° C. to 300° C. More typically, flash points range from 140° C. to 200° C. Alkoxylated glycols, their mono-methyl ether and mono-methyl ether acetate derivatives used in the aqueous alkaline cleaning and etching compositions are either water-soluble or at least water-miscible. The flash points of 75° C. or greater provide non-volatile compositions preventing substantial evaporation of composition components. In addition, alkoxylated glycols, their mono-methyl ether and mono-methyl ether acetate derivatives with boiling points of 190° C. or greater further reduce the amounts lost at operating temperatures. Accordingly, the compositions may be used over longer periods of time than many conventional cleaning compositions.

Alkoxylated glycols, their mono-methyl ether and mono-methyl ether acetate derivatives are included in the aqueous composition in amounts of 0.01 wt % to 2 wt % of the aqueous solution. Typically, the alkoxylated glycols, their mono-methyl ether and mono-methyl ether acetate derivatives are included in amounts of 0.1 wt % to 1 wt % of the aqueous composition. The alkoxylated glycols, their mono-methyl ether and mono-methyl ether acetate derivatives are non-cyclic but are linear or branched compounds. Alkoxylated glycols, their mono-methyl ether and mono-methyl ether acetate derivatives include, but are not limited to, compounds having a general formula:

$$RO(C_aH_{2a}O)_mY \quad (III)$$

wherein R is —$CH_3$ or —H, Y is —H or —$C(O)CH_3$, and "m" is an integer of 3 or greater, or such as from 8 to 66. Typically, m is an integer of 3 to 6, more typically from 3 to 5 and "a" is an integer of 3 to 6, or such as from 3 to 4. Typically R is —H and Y is —H. Examples of such alkoxylated glycols are tripropylene glycol, tetrapropylene glycol, polypropylene glycol, tributylene glycol, tetrabutylene glycol, polybutylene glycol, tripentylene glycol, tetrapentylene glycol and polypentylene glycol.

Alkoxylated glycols also include, but are not limited to, compounds having a general formula:

$$HO(CH_2CH_2O)_nH \quad (IV)$$

wherein "n" is an integer of 3 or greater, or such as from 5 to 200. Typically, n is an integer of 3 to 5, more typically from 3 to 4. Examples of such alkoxylated glycols are triethylene glycol, tetraethylene glycol and polyethylene glycol.

Optionally, the aqueous alkaline cleaning and micro-etching compositions include one or more chelating agents. Chelating agents are included in the compositions in amounts of 0.001 wt % to 5 wt %, or such as from 0.01 wt % to 1 wt %. Such chelating agents include, but are not limited to, ethylenediamine tetraacetic acid and its salts, polycarboxylic acids and their salts. Examples of dicarboxylic acids are iminodiacetic acid, oxalic acid, malonic acid, succinic acid, glutaric acid, adipic acid, pimelic acid, maleic acid, fumaric acid and phthalic acid and their salts. Examples of tricarboxylic acids are nitrilotriacetic acid, trimellitic acid tricarballylic acid and their salts. Typically the salts of the acids are used, such as their alkali metal salts to help maintain an alkaline environment of pH 11 and greater.

In addition to one or more mid-range alkoxylate nonionic surfactants, the aqueous alkaline cleaning and micro-etching composition may include one or more additional surfactants which do not compromise the cleaning and micro-etching performance of the composition. Such surfactants may be conventional nonionic, anionic, cationic, amphoteric and gemini (dimeric) surfactants. Typically, the surfactants are nonionic. Such surfactants are included in the compositions in amounts of 0.001 wt % to 3 wt %, or such as from 0.01 wt % to 1 wt %.

A gemini surfactant (GS) includes two conventional surfactant molecules chemically bonded together by a spacer. Two terminal hydrocarbon tails may be short or long; two polar head groups may be cationic, anionic or nonionic. The spacer may be short or long, flexible or rigid. The GS need not be symmetrically disposed about the center of the spacer. The hydrophilic and hydrophobic groups of each surfactant moiety may be any of those known to be used in conventional surfactants having one hydrophilic group and one hydrophobic group. For example, a typical nonionic gemini surfactant, e.g., a bis-polyoxyethylene alkyl ether, may contain two polyoxyethylene alkyl ether moieties. One type of gemini surfactant which may be included in the cleaning compositions are the nonionic gemini surfactants disclosed in U.S. Pat. No. 5,945,393.

In one embodiment the aqueous alkaline cleaning and micro-etching composition consists essentially of one or more quaternary ammonium salts, one or more alkali metal salts and one or more mid-range alkoxylated nonionic surfactants. In another embodiment the aqueous alkaline cleaning and micro-etching composition consists essentially of one or more quaternary ammonium salt, one or more alkali metal hydroxide, one or more mid-range alkoxylated nonionic surfactants and one or more chelating agents.

The combination of the one or more quaternary ammonium hydroxides, the one or more alkali metal hydroxides and the one or more mid-range alkoxylated nonionic surfactants enable a simultaneous cleaning and micro-etching method which removes metal, metal oxide and organic contaminants as well as encrusted residues from the semiconductor wafer. In addition the aqueous alkaline cleaning and micro-etching compositions are low foaming, thus they are highly compatible with spray cleaning apparatus. For example, in a spray cleaning process the foaming can cause problems by reaching level sensors in spray equipment and subsequently causing the equipment to turn off.

The semiconductors cleaned and micro-etched with the aqueous alkaline cleaning and micro-etching composition may be used in devices which convert incident light, such as light from sunlight, lasers, fluorescent light, as well as other sources of light, into electric energy. Such devices include, but are not limited to photovoltaic devices, such as solar cells, optical and electrochemical detectors/sensors, biodetectors/biosensors, catalysts, electrodes, gate electrodes, ohmic contacts, interconnection lines, Schottky barrier diode contacts and optoelectronic components.

The semiconductor wafers cut from the ingots and cleaned and micro-etched with the aqueous alkaline cleaning and micro-etching compositions are typically wafers which may be circular, square or rectangular in shape or may be any other suitable shape. Such wafers may have a wide variety of dimensions and surface resistivities. For example, circular wafers may have a diameter of 150 nm, 200 nm, 300 nm, 400 nm, or greater.

In the manufacture of a photovoltaic device or solar cell, the entire back side of the wafer may be metal coated or a portion of the back side may be metal coated, such as to form a grid. Such back side metallization may be provided by a variety of techniques, and may be done prior to the metallization of the front side of the wafer. In one embodiment, a metal coating is applied to the back side in the form of an electrically conductive paste, such as a silver-containing paste, an aluminum-containing paste or a silver and aluminum-containing paste; however, other suitable pastes known in the art also may be used. Such conductive pastes typically include conductive particles embedded in a glass matrix and an organic binder. Conductive pastes may be applied to the wafer by a variety of techniques, such as screen printing. After the paste is applied, it is fired to remove the organic binder. When a conductive paste containing aluminum is used, the aluminum partially diffuses into the back side of the wafer, or if used in a paste also containing silver, may alloy with the silver. Use of such aluminum-containing paste may improve the resistive contact and provide a "p+"-doped region. Heavily doped "p+"-type regions by previous application of aluminum or boron with subsequent interdiffusion may also be produced. Optionally, a seed layer may be deposited on the back side of the wafer and a metal coating may be deposited on the seed layer by electroless or electrolytic plating.

To produce the semiconductor junction, phosphorus diffusion or ion implantation takes place on the front side of the wafer to produce an n-doped (n+ or n++) region and provides the wafer with a PN junction. The n-doped region may be referred to as the emitter layer.

Texturing is typically done to form pyramid type structures on the emitter layer to reduce reflectance and improve incident light absorbance by the wafer, thus increasing the amount of light which is converted into electrical energy. Various conventional methods are known in the art to form pyramid structures on emitter layers.

An anti-reflective layer is added to the front side or emitter layer of the wafer. In addition the anti-reflective layer may serve as a passivation layer. Suitable anti-reflective layers include, without limitation, silicon oxide layers such as $SiO_x$, silicon nitride layers such as $Si_3N_4$, a combination of silicon oxide and silicon nitride layers, and combinations of a silicon oxide layer, a silicon nitride layer with a titanium oxide layer such as $TiO_x$. In the foregoing formulae, x is an integer representing the number of oxygen atoms. Such anti-reflective layers may be deposited by a number of techniques, such as by various vapor deposition methods, for example, chemical vapor deposition and physical vapor deposition.

The front side of a wafer contains a metallized pattern. For example, the front side of a wafer may be composed of current collecting lines and current busbars. Current collecting lines are typically transverse to the busbars and typically have a relatively fine-structure (i.e. dimensions) relative to current busbars.

The pattern reaches through the antireflective layer to expose the surface of the semiconductor body of the wafer. Alternatively trenches may be formed in the openings to create a selective emitter. These trenches may be regions of high doping. A variety of processes may be used to form the pattern, such as, but not limited to, laser ablation, mechanical means, and lithographic processes, all of which are well known in the art. Such mechanical means include sawing and scratching. Typical photolithographic processes include disposing an imageable material on the surface of the wafer, patterning the imageable material to form openings in the anti-reflective layer, transferring the pattern to the wafer, depositing a nickel layer in the openings and removing the imageable material. In one embodiment, the imageable material is removed before the step of depositing a metal layer in the openings. In another embodiment, the imageable material is removed after the step of depositing a metal layer in the openings. When the imageable material is present during the metal deposition step, such imageable material typically avoids any dyes, such as contrast dyes, that absorb in the wavelength of radiation used during the nickel deposition step. Imageable material present during the plating step typically contains a dye which has a minimum light transmittance of 40% to 60%.

The imageable material may be removed using any suitable polymer remover. Such removers may be alkaline, acidic or essentially neutral and are well known in the art.

In one embodiment, the front side of the wafer may be metallized using a conductive paste, which may be the same as or different from any conductive paste used on the rear side of the wafer. Any conductive paste used to metallize the front side of a wafer typically does not contain aluminum. The temperature used in the firing of the paste depends on the particular paste used, the thickness of any antireflective layer used, among other factors. The choice of such temperature is well within the ability of those skilled in the art. Also, it is appreciated by those skilled in the art that the firing process may be performed in an oxygen-containing atmosphere, an inert atmosphere, a reducing atmosphere, or a combination of any of these. For example, the firing may be performed at a first temperature in an atmosphere containing little oxygen and then at a second temperature under an inert atmosphere or under a reducing atmosphere, where the second temperature is higher than the first temperature.

Following the firing process, the wafer may optionally be contacted with a buffered acid solution, such as a buffered hydrofluoric acid solution, to remove any oxide produced during the firing procedure. Such contact may be by spraying the solution on the wafer or by dipping the wafer into such solution or by any other suitable means.

After the front side pattern and rear side of the wafer are metallized using conductive paste, a layer of metal is then deposited on the front side conductive pattern. Such layer of metal may be any suitably conductive metal such as gold, silver or copper, and is typically silver. Such metals may be deposited by methods known in the art. In one embodiment, the deposited metal layer is composed of the same metal used in the conductive paste. For example, a silver layer is deposited on a silver-containing conductive paste.

Silver may deposited by light induced plating (LIP) or conventional silver electroplating methods well known in the art. When LIP is used, the rear side of the semiconductor wafer is connected to a source of external current (rectifier). A silver anode placed in the silver plating composition is connected to the rectifier such that a completed circuit is formed between the components. Typical current densities are from 0.1 A/dm$^2$ to 5 A/dm$^2$. The total current requirement is dependent upon the particular size of the wafer used. Additionally, the silver anode provides a ready source of silver ions to replenish the silver plating composition with silver ions without the need to use an external source. A light source is positioned to illuminate the semiconductor wafer with light energy. The light source can be, for example, a fluorescent or LED lamp which provides energy within the wavelengths to which the semiconductor wafer is photovoltaically sensitive. A variety of other light sources may be used, such as, but not limited to, incandescent lamps such as a 75 watt and 250 watt lamps, mercury lamps, halogen lamps and a 150 watt IR lamp. Examples of commercially useful silver plating compositions are available as ENLIGHT™ Silver Plate 600 and 620 from Rohm and Haas Electronic Materials, LLC Marlborough, Mass.

The plating cell is of such a material as to be chemically inert with respect to the silver plating composition and has a minimum light transmittance of 40-60%. Alternatively, the wafer can be positioned horizontally in the plating cell and illuminated from above the silver plating composition, in which case the plating cell need not have at least the minimum light transmittance.

In another embodiment a metal seed layer may be deposited on the front side conductive pattern instead of a metal paste. Typically the metal seed layer is nickel. The nickel seed layer may be deposited by any conventional nickel deposition method known in the art. Typically, the nickel seed layer is deposited by light assisted nickel deposition. If the source of the nickel is an electroless nickel composition, plating is done without application of external current. If the source of the nickel is from an electrolytic nickel composition, a rear side potential (rectifier) is applied to the semiconductor wafer substrate. The light may be continuous or pulsed. Prior to depositing nickel, surface oxides are typically removed from the conductive pattern using a solution of 1% hydrofluoric acid.

Light which may be used in the plating process includes, but is not limited to, visible light, IR, UV and X-rays. Light sources include, but are not limited to, incandescent lamps, LED lights (light emitting diodes), infrared lamps, fluorescent lamps, halogen lamps and lasers. In general the amount of light applied to the semiconductor may be 8000 1× to 20,000 1×.

Typically, nickel is deposited through the openings in the anti-reflective layer and onto the exposed textured surface of the semiconductor wafer using an electroless nickel plating composition. Examples of commercially available electroless nickel compositions include DURAPOSIT™ SMT 88 Electroless Nickel and NIPOSIT™ PM 980 and PM 988 Electroless Nickel. All are available from Rohm and Haas Electronic Materials, LLC, Marlborough, Mass., U.S.A.

Alternatively, electrolytic nickel compositions may be used. When an electrolytic composition is used, an applied rear side potential (rectifier) is used in addition to light to deposit the nickel. Typical current densities are from 0.1 A/dm$^2$ to 2 A/dm$^2$. The particular current requirement is dependent upon the particular size of the wafer used. The electroplating processes used are conventional. Suitable electrolytic nickel plating baths are commercially available as well as many which are disclosed in the literature. Examples of commercially available electrolytic nickel baths are the NICKEL GLEAM™ Electrolytic Nickel products obtainable from Rohm and Haas Electronic Materials, LLC.

By illuminating the front of the semiconductor wafer with light energy, plating occurs on the front. The impinging light energy generates a current in the semiconductor. The rate of plating on the front is controllable by adjusting the light intensity, bath temperature, reducing agent activity, starting wafer conditions, doping level as well as other parameters which are known to workers in the art. If the plating bath is an electrolytic bath the rate of plating may also be adjusted by the rectifier. A nickel layer of 20 nm to 300 nm thickness is typically desired, with the exact thickness depending on various factors such as on the application, size, pattern and geometry.

After the nickel is deposited through the openings and adjacent to the exposed surface of the semiconductor wafer substrate, silver is then deposited adjacent to the nickel. Conventional electroplating silver compositions may be used. The silver compositions may be cyanide containing silver compositions or cyanide-free silver compositions.

Silver may deposited on the nickel by light induced plating (LIP) or conventional silver electroplating methods well known in the art. The procedure of LIP plating is similar to that for plating the silver paste described above. A silver layer of 1 μm to 30 μm thickness is typically desired, with the exact thickness depending on various factors such as on the application, size, pattern and geometry.

After the silver metal is deposited onto and adjacent the nickel, the semiconductor is then sintered to form nickel silicide. Sintering is done with the silver deposited onto the nickel surface to improve adhesion between the silver and nickel. The improved bonding between the nickel and the silicon reduces the probability of adhesion failure between the nickel silicide and the silver. Further, silver is not incorporated into the silicide by the sintering temperatures, thus nickel silicide is formed with the silver protecting the nickel from oxidation during sintering. A furnace providing a wafer peak temperature of 380° C. to 550° C. may be used. Typically, peak temperature times range from 2 seconds to 20 seconds. An example of a suitable furnace is a lamp based furnace (IR).

Since the silver layer protects the nickel from oxidation during sintering, sintering may be done in oxygen containing environments as well as inert gas atmosphere or vacuum. In general, sintering is done for 3 min. to 10 min. Line speeds at which the semiconductor passes through the furnace may vary depending on the furnace used. Minor experimentation may be done to determine the appropriate line speed. Typically, the line speed is from 330 cm/minute to 430 cm/minute.

After the semiconductor is metallized additional conventional steps may be performed on the metallized semiconductor to complete the formation of the photovoltaic device. Such methods are well known in the art.

The following Examples are intended to further illustrate the invention but are not intended to limit the scope of the invention.

EXAMPLE

A monocrystalline silicon ingot is bonded to a contact plate and an attachment jig. This is loaded on a conventional wire saw apparatus. The wire saw is coated with abrasive silicon carbide particles. During cutting a slurry containing polyethylene glycol and #600 to #1000 size silicon carbide particles in a weight ratio of 1:1 is sprayed from slurry nozzles of the apparatus onto the ingot. Contaminants of copper, zinc and iron prior to cleaning are greater than 1 mg. The monocrystalline silicon wafers which are cut from the ingot are then cleaned and micro-etched for 10 minutes at 90° C. with an aqueous alkaline composition composed of 0.5 wt % tetramethyl ammonium hydroxide, 0.4 wt % potassium hydroxide, 0.25 wt % tripropylene glycol, 0.1 wt % sodium salt of iminodiacetic acid and 0.05 wt % of a blend of mid-range nonionic surfactants of formula II where x is 4 to 5, y is 3 to 6, $R^1$ is $C_{8-9}$ branched alcohol and $R^2$ is $CH_3$. The balance is water. The pH of the composition is 12. Cleaning and micro-etching is done by spraying the wafers with the aqueous alkaline composition using a conventional spraying apparatus. The depth of the micro-etching is 0.05 μm to 0.5 μm.

After cleaning and micro-etching, the silicon wafers are analyzed for metal contaminants from the cutting process by abstraction with 30% nitric acid mixture at room temperature for 20 minutes and then conventional atomic absorption spectroscopy using a Varian Graphite Furnace AA 2807 Zeeman Atomic Absorption Spectrophotometer. Copper and zinc are below the detectable level while iron is around 0.4 ppb.

What is claimed is:

1. A method comprising:
   a) providing a semiconductor ingot;
   b) cutting the semiconductor ingot to form one or more semiconductor wafers comprising inorganic contaminants and organic contaminants; and
   c) applying an aqueous alkaline solution consisting essentially of one or more quaternary ammonium hydroxides and one or more alkali metal hydroxides at a weight ratio of 2:1 to 1:2, one or more chelating agents, one or more alkoxylated glycols, mono-methyl ether or mono-methyl ether acetate derivatives thereof and having a weight average molecular weight of 170 g/mole or greater and a flash point of 75° C. or greater and one or more mid-range alkoxylates in sufficient amounts to remove the contaminants and micro-etch the semiconductor wafers.

2. The method of claim 1, wherein the one or more mid-range alkoxylates are chosen from compounds having a formula:

$$R^1\text{—O—}[(CH_2CH(R^2)\text{—O})_x(CH_2CH_2O)_y]_z\text{—H} \quad (I)$$

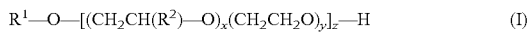

wherein x is independently at each occurrence, 0 or a real number from 1 to 11, provided that, in at least one occurrence, x is greater than 0; y is, independently at each occurrence, 0, or a real number from 1 to 20, provided that, in at least one occurrence, y is greater than 0; z is a whole number from 1 to 50; $R^1$ is a $C_{6-10}$ branched or linear alcohol; and $R^2$ is, independently at each occurrence, $\text{—CH}_3$ or $\text{—CH}_2CH_3$.

3. The method of claim 1, wherein the one or more mid-range alkoxylates are chosen from compounds having a formula:

$$R^1\text{—O—}(CH_2CH(R^2)\text{—O})_x(CH_2CH_2O)_y\text{—H} \quad (II)$$

wherein x is a real number from 1 to 11; y is a real number from 1 to 20; $R^1$ is $C_{6-10}$ branched or linear alcohol; and $R^2$ is $\text{—CH}_3$ or $\text{—CH}_2CH_3$.

4. The method of claim 1, wherein the weight ratio of the one or more quaternary ammonium hydroxides to the one or more alkali metal hydroxides is 1:1.

5. The method of claim 1, wherein a pH of the aqueous alkaline solution is 11 and greater.

6. The method of claim 1, wherein the contaminants comprise metals, metal oxides and organic compounds.

7. The method of claim 1, wherein the semiconductor wafers are micro-etched to an irregular surface roughness of 0.025 μm to 2 μm peak-to-valley height.

* * * * *